(12) United States Patent
Honda

(10) Patent No.: US 6,445,062 B1
(45) Date of Patent: Sep. 3, 2002

(54) SEMICONDUCTOR DEVICE HAVING A FLIP CHIP CAVITY WITH LOWER STRESS AND METHOD FOR FORMING SAME

(75) Inventor: Hirokazu Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/506,139

(22) Filed: Feb. 17, 2000

(30) Foreign Application Priority Data

Feb. 19, 1999 (JP) .............................. 11-041994

(51) Int. Cl.⁷ .............................................. H01L 23/02
(52) U.S. Cl. ........................ 257/678; 257/718; 257/721; 257/747
(58) Field of Search ................................ 257/666, 678, 257/704, 718, 721, 735, 747; 438/106

(56) References Cited

U.S. PATENT DOCUMENTS

| | | | |
|---|---|---|---|
| 5,889,323 A | * | 3/1999 | Tachibana |
| 5,893,726 A | * | 4/1999 | Farnworth .................. 438/108 |
| 5,909,057 A | * | 6/1999 | McCormick |
| 6,054,008 A | * | 4/2000 | Chan .......................... 257/678 |
| 6,057,597 A | * | 5/2000 | Farnworth |
| 6,232,652 B1 | * | 5/2001 | Matsushima ................. 257/667 |
| 6,300,673 B1 | * | 10/2001 | Hoffman ..................... 257/666 |
| 6,313,521 B1 | * | 11/2001 | Baba |
| 6,335,563 B1 | * | 1/2002 | Hashimoto .................. 257/632 |

FOREIGN PATENT DOCUMENTS

| | | | |
|---|---|---|---|
| JP | 61-8957 | | 1/1986 |
| JP | 403169052 A | * | 7/1991 |
| JP | 4-73955 | | 3/1992 |
| JP | 4-279049 | | 10/1992 |
| JP | 6-89945 | | 3/1994 |
| JP | 7-153864 | | 6/1995 |
| JP | 9-64221 | | 3/1997 |
| JP | 11-204552 | | 7/1999 |

* cited by examiner

Primary Examiner—Olik Chaudhuri
Assistant Examiner—Nathan W. Ha
(74) Attorney, Agent, or Firm—Hutchins, Wheeler & Dittmar

(57) ABSTRACT

There is provided a semiconductor device including (a) a substrate, (b) a semiconductor chip mounted on the substrate, (c) a wall having a closed cross-section and mounted on the substrate such that the semiconductor chip is surrounded by the wall, and (d) a cover covering the wall therewith so that a closed cavity is defined by the substrate, the wall and the cover, the cavity being designed to be under a pressure almost equal to an atmospheric pressure at a temperature highest in both steps of fabricating the semiconductor device and steps expectable after the semiconductor device is completed. The semiconductor device can prevent defectiveness such as electric leakage and electromigration, and further prevent occurrence of "popcorn" phenomenon which might occur in an annealing step.

31 Claims, 13 Drawing Sheets

FIG.3A PRIOR ART
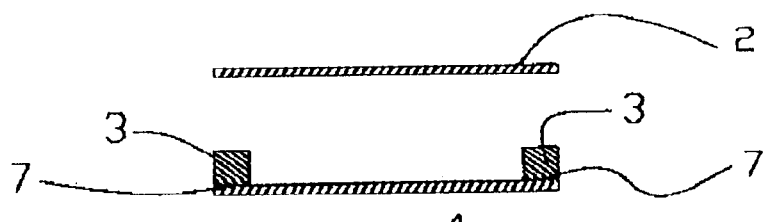
FIG.3B PRIOR ART
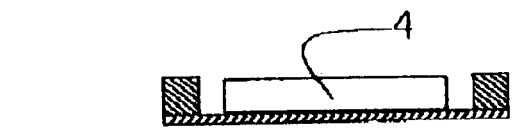
FIG.3C PRIOR ART
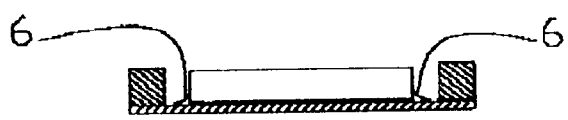
FIG.3D PRIOR ART
FIG.3E PRIOR ART
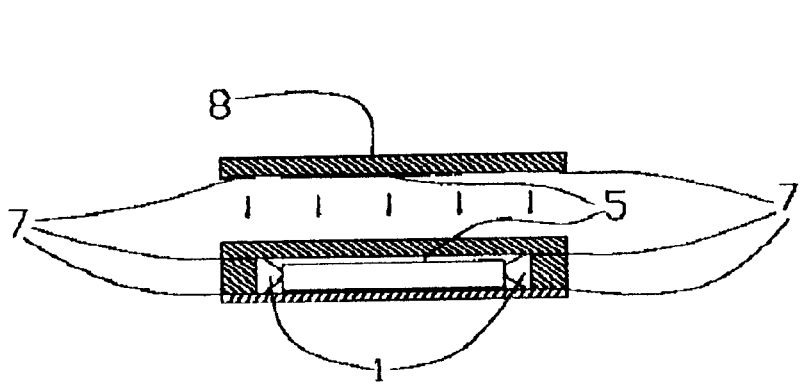
FIG.3F PRIOR ART
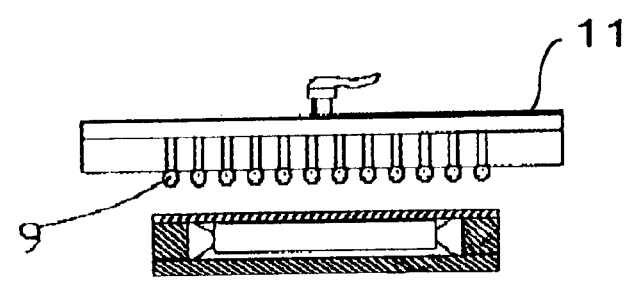
FIG.3G PRIOR ART
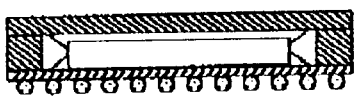

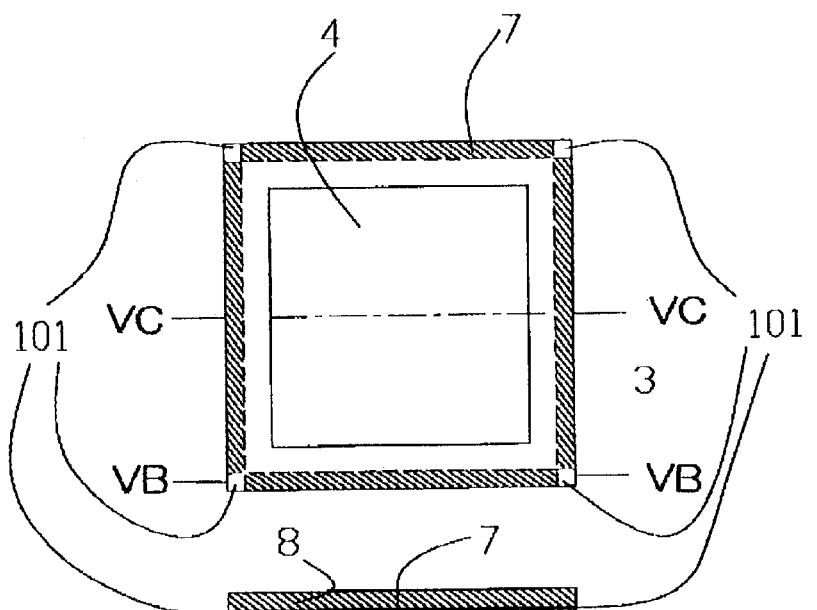
FIG.5A
PRIOR ART
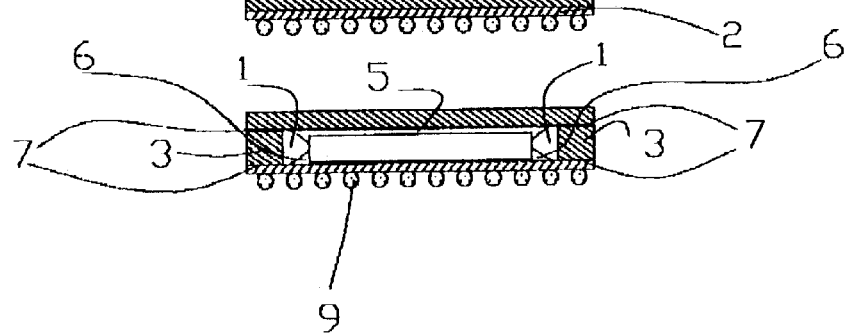
FIG.5B
PRIOR ART
FIG.5C
PRIOR ART

MOVEMENT OF NOZZLES
IN HORIZONTAL PLANE

MOVEMENT OF NOZZLES
IN VERTICAL PLANE

COMPLETION OF
SEMICONDUCTOR
DEVICE

CURING RESIN
FIXING COVER

HEATING SUBSTRATE

MOVEMENT OF
SEMICONDUCTOR DEVICE

SEMICONDUCTOR DEVICE HAVING A FLIP CHIP CAVITY WITH LOWER STRESS AND METHOD FOR FORMING SAME

BACKGROUND OF THE INVENTION

1. Field of the Invention

The invention relates to a semiconductor device and a method of fabricating the same, and more particularly to a semiconductor device having a cavity therein, such as a flip-chip type semiconductor device, and a method of fabricating the same.

2. Description of the Related Art

A semiconductor package comprised of a substrate composed of organic material and a semiconductor chip flip-chip-mounted on the substrate generally has a cavity inside thereof.

FIGS. 1A to 1C illustrate a conventional semiconductor device. FIG. 1A is a top view of the semiconductor device with a cover taken away, FIG. 1B is a cross-sectional view taken along the line IB—IB in FIG. 1A, and FIG. 1C is a cross-sectional view taken along the line IC—IC in FIG. 1A.

The illustrated conventional semiconductor device is comprised of a square substrate 2, a square semiconductor chip 4 mounted centrally on the substrate 2, a wall 3 having a cross-section of a hollow square pole and mounted on edges of the substrate 2 so that the semiconductor chip 4 is surrounded by the wall 3, a square cover 8 covering the wall 3 therewith, first adhesive 7 adhering the cover 8 to the wall 3 and also adhering the wall 3 to the substrate 2, second adhesive 5 applied between the semiconductor chip 4 and a lower surface of the cover 8 for radiating heat therethrough, and a plurality of spherical solder balls 9 arranged on a lower surface of the substrate 2.

The cover 8 has almost the same area as an area of the substrate 2. The semiconductor chip 4 has a projected area smaller than an area of the cover 8. The wall 3 has four sides each of which is equal in length to each of sides of the substrate 2, and is coextensive with the substrate 2.

The substrate 2 may be comprised of a film or may have a multi-layered structure composed of organic material. The wall 3 is composed of copper. The cover 8 is composed of a material having a high thermal conductivity, such as copper, aluminum, silicon carbide, and aluminum nitride. The first adhesive is composed of epoxy having a low coefficient of water absorption, cyanate ester, or polyolefin.

Pads (not illustrated) formed on the substrate 2 make contact with bumps (not illustrated) formed at a surface of the semiconductor chip 4 to thereby ensure electrical connection between the substrate 2 and the semiconductor chip 4. The wall 3 is mounted on the substrate 2 in order to enhance mechanical strength of the semiconductor device. The wall 3 is adhered to the substrate 2 through the first adhesive 7 without a gap. The cover 8 is adhered to the wall 3 through the first adhesive 7 in an opposite side of the substrate 2.

The second adhesive 5 is applied between an upper surface of the semiconductor chip 4 and a lower surface of the cover 8 to thereby hermetically adhere the semiconductor chip 4 to the cover 8 without any gap. The solder balls 9 are equally spaced from one another on a lower surface of the substrate 2.

The conventional semiconductor device having the above-mentioned structure is accompanied with a problem that since there is a difference in a thermal expansion coefficient between silicon of which the semiconductor chip 4 is composed and organic material of which the substrate 2 is composed, the substrate 2 is deformed in an annealing step to be carried out after flip-chip mounting of the semiconductor chip 4 onto the substrate 2, resulting in that solder connection is peeled off, or that the semiconductor chip 4 is peeled off the substrate 2, as illustrated in FIGS. 2A and 2B.

In order to solve this problem, an attempt has been made to introduce underfilling resin between the semiconductor chip 4 and the substrate 2, and then, cure the underfilling resin. This attempt ensures enhancement in strength around bumps, and provides resistance to deformation to the substrate 2.

FIGS. 3A to 3G are cross-sectional views of a conventional semiconductor device in which a semiconductor chip is fixed on a substrate through underfilling resin. Hereinbelow is explained the method of fabricating such a semiconductor chip, with reference to FIGS. 3A to 3G.

First, as illustrated in FIG. 3A, there is prepared the substrate 2.

Then, as illustrated in FIG. 3B, the wall 3 having a cross-section of a hollow square pole is fixed on the substrate through the first adhesive 7.

Then, as illustrated in FIG. 3C, the semiconductor chip 4 is electrically connected to the substrate 2 by causing pads (not illustrated) of the substrate 2 to make contact with bumps (not illustrated) of the semiconductor chip 4. Then, a product resulting from the step illustrated in FIG. 3C is washed with flux.

Then, as illustrated in FIG. 3D, underfilling resin 6 is coated between the substrate 2 and the semiconductor chip 4, and then, heated. As a result, the underfilling resin 6 is cured and thus adhered to both the substrate 2 and the semiconductor chip 4.

Then, the second adhesive 5 for radiating heat therethrough is applied onto an upper surface of the semiconductor chip 4. Then, the cover 8 is put on the wall 3, as illustrated in FIG. 3E. Since the first adhesive 7 is applied to a lower surface of the cover 8 at a peripheral area thereof, the cover 8 is adhered to the wall 3. Then, the semiconductor device is heated. As a result, the first adhesive 7 is cured, and accordingly, the wall 3 is fixed to both the substrate 2 and the cover 8.

Then, the semiconductor device is turned upside down, and thereafter, the solder balls 9 are adhered to a lower surface of the substrate 2 by means of a jig 11. The solder balls 9 are vacuum-sucked to the jig 11, and the solder balls 9 are mounted onto a lower surface of the substrate 2 at a time, as illustrated in FIG. 3F.

Then, a product resulting from the step illustrated in FIG. 3F is washed with flux. Thus, the semiconductor device as illustrated in FIG. 3G is completed.

The semiconductor device illustrated in FIG. 3G has the same structure as the structure of the semiconductor device illustrated in FIGS. 1A to 1C except addition of the underfilling resin 6. The underfilling resin 6 is liquid resin containing epoxy, cyanate ester or polyolefin as a main constituent.

In the process of fabricating the semiconductor device illustrated in FIGS. 3A to 3G, annealing steps are carried out twice, one for curing the underfilling resin 6 in the step illustrated in FIG. 3D, and the other for curing the second adhesive 7 in the step illustrated in FIG. 3E. In addition, three annealing steps are carried out each for aging, baking and mounting the semiconductor device on a printed wiring board, after the semiconductor device has been completed.

Those annealing steps are carried out at a temperature of about 125, 125 and 230 degrees centigrade, respectively.

Though the above-mentioned problem of deformation of the substrate 2 is caused even in the annealing steps to be carried out after the semiconductor device has been completed, the addition of the underfilling resin 6 can prevent occurrence of the problem.

However, after the underfilling resin 6 has been cured, the underfilling resin 6 contracts, causing another problem that the substrate 2 is made bent, and the semiconductor chip 4 is cracked.

Japanese Unexamined Patent Publication No. 11-204552 published on Jul. 30, 1999 has suggested a solution to this problem. Specifically, Japanese Unexamined Patent Publication No. 11-204552 has suggested a semiconductor device including an underfilling resin coated between a printed wiring board and a semiconductor chip, and adhesive partially coated onto the semiconductor chip for radiating heat therethrough. The underfilling resin and the adhesive are to be concurrently cured. As a result, even if stresses are generated due to contraction of the resin, those stresses are cancelled each other and relaxed, preventing the semiconductor device from being made bent or deformed.

The semiconductor device suggested in Japanese Unexamined Patent Publication No. 11-204552 has the same structure as the structure of the semiconductor device illustrated in FIG. 3G.

Though Japanese Unexamined Patent Publication No. 11-204552 is explained herein, it should be noted that the applicant does not admit that the Publication constitutes prior art under any provisions in 35 U.S.C. The Publication is explained only for the purpose of better understanding of the present invention.

A method of fabricating the semiconductor device is explained hereinbelow with reference to FIGS. 4A and 4B.

First, similarly to the method having been explained with reference to FIGS. 3A to 3G, the underfilling resin 6 is applied between the substrate 2 and the semiconductor chip 4, as illustrated in FIG. 4A. At this stage, the underfilling resin 6 is not cured yet.

Then, the solder balls 9 are adhered onto a lower surface of the substrate 2, as illustrated in FIG. 4B.

Then, the semiconductor device is annealed for the first time to thereby concurrently cure the underfilling resin 6 and the adhesive 5. By concurrently curing the underfilling resin 6 and the adhesive 5, even if stresses are generated due to contraction of the resin 6, those stresses are cancelled each other and relaxed, preventing the semiconductor device from being made bent or deformed.

However, air enclosed in a cavity 1 defined by the substrate 2, the wall 3 and the cover 8 expands in volume due to the annealing, resulting in generation of stresses in the semiconductor device. Such stresses cause many problems that the substrate 2 is destroyed, the adhesive 5 is peeled off, and the underfilling resin 6 peels off the semiconductor chip 4.

In order to solve this problem, Japanese Unexamined Patent Publication No. 11-204552 also suggests a semiconductor device and a method of fabricating the same, in which adhesive composed of organic material in liquid or in the form of a sheet is applied between the cover and the wall, and the adhesive is patterned such that there is formed a hole through which air passes, after adhesion of the cover and the wall. According to the Publication, the semiconductor device solves the above-mentioned problems of destruction of the substrate 2, peel-off of the adhesive 5, and peel-off of the underfilling resin 6 from the semiconductor chip 4, all caused by internal stresses which are generated due to expansion of air in the cavity 1.

FIGS. 6A to 5C illustrate the suggested semiconductor device. FIG. 5A is a top view of the semiconductor device with the cover taken away, FIG. 5B is a cross-sectional view taken along the line VB—VB in FIG. 1A, and FIG. 5C is a cross-sectional view taken along the line VC—VC in FIG. 5A.

In the semiconductor device, the adhesive 7 is not applied in a certain region onto an upper surface of the wall 3. For instance, the adhesive 7 is not applied at four corners 101 in an upper surface of the wall 3, as illustrated in FIG. 5A. The suggested semiconductor device has the same structure as the structure of the semiconductor device illustrated in FIG. 3G.

According to Japanese Unexamined Patent Publication No. 11-204552, the regions 101 in which the adhesive 7 is not applied can prevent the above-mentioned problems caused by expansion of air enclosed in the cavity 1.

However, the formation of the regions 101 causes another problem. That is, when the semiconductor device is washed with flux, flux enters the semiconductor device through the regions 101 in which the adhesive 7 is not applied. If the semiconductor device is insufficiently washed with pure water, flux remains residual in the semiconductor device. The residual flux causes electric leakage, electromigration and other problems, resulting in deterioration in reliability of the semiconductor device.

Even after the semiconductor device is completed, moisture enter the semiconductor device through the regions 101, in which case, the moisture is mixed with the residual flux to thereby cause problems such as electric leakage ad electromigration.

In addition, the underfilling resin 6 absorbs the moisture, resulting in that the semiconductor device is expanded in an annealing step, which is called "popcorn" phenomenon, and hence, the underfilling resin 6 is peeled off the semiconductor chip 4.

SUMMARY OF THE INVENTION

In view of the above-mentioned problems, it is an object of the present invention to provide a semiconductor device having a cavity therein, such as a flip-chip type semiconductor device, which is capable of preventing electric leakage and electromigration, and also preventing occurrence of "popcorn" phenomenon which might occur in an annealing step.

It is also an object of the present invention to provide a method of fabricating such a semiconductor device.

In one aspect of the present invention, there is provided a semiconductor device including (a) a substrate, (b) a semiconductor chip mounted on the substrate, (c) a wall having a closed cross-section and mounted on the substrate such that the semiconductor chip is surrounded by the wall, and (d) a cover covering the wall therewith so that a closed cavity is defined by the substrate, the wall and the cover, the cavity being designed to be under such a pressure that a predetermined difference between pressures inside and outside the cavity is accomplished at a predetermined temperature.

A force exerting on the semiconductor device varies due to a difference between pressures inside and outside the cavity. In addition, a volume of gas passage through the cavity also varies in dependence on the force. Hence, the predetermined pressure is determined experimentally or based on simulation, in order to control both the force exerting on the semiconductor device and gas passage through the cavity.

For instance, if the cavity is rendered under a pressure higher than an external pressure, a difference between a pressure in the cavity and an external pressure would prevent external air containing moisture from entering the semiconductor device, ensuring that electrical connections in the semiconductor device are kept away from moisture, dust and other foreign materials.

As an alternative, if the cavity is rendered under a pressure lower than an external pressure, it would be possible to prevent deformation of the substrate due to an increase in pressure in the cavity, resulted from an increase in temperature in an annealing step.

As a result, it would be possible to prevent electric leakage and electromigration, and also prevent occurrence of "popcorn" phenomenon which might occur in an annealing step.

There is further provided a semiconductor device including (a) a substrate, (b) a semiconductor chip mounted on the substrate, (c) a wall having a closed cross-section and mounted on the substrate such that the semiconductor chip is surrounded by the wall, and (d) a cover covering the wall therewith so that a closed cavity is defined by the substrate, the wall and the cover, the cavity being designed to be under a pressure almost equal to an atmospheric pressure at a temperature highest in both steps of fabricating the semiconductor device and steps expectable after the semiconductor device is completed.

By rendering the cavity under the above-mentioned pressure, it would be possible to prevent deformation of the substrate due to an increase in pressure in the cavity, resulted from an increase in temperature in an annealing step.

It is preferable that the wall and/or the cover are/is formed with at least one through-hole through which a pressure in the cavity can be adjusted, and that the semiconductor device further includes a plug clogging the through-hole therewith.

For instance, the plug may be composed of thermosetting resin.

It is preferable that the plug is composed of a material which is not deformed in a temperature range of a room temperature to a temperature highest in both steps of fabricating the semiconductor device and steps expectable after the semiconductor device is completed.

By composing the adhesive of such a material, it would be possible to prevent gas passage between the cavity and outside of the semiconductor device while the semiconductor device is being fabricated, and even after the semiconductor device is completed.

It is preferable that at least one through-hole through which a pressure in the cavity can be adjusted is formed between the substrate and the wall, and that the semiconductor device further includes first adhesive clogging the through-hole therewith.

It is preferable that the semiconductor device further includes second adhesive through which the wall is adhered to the substrate, the second adhesive being not applied in at least one region between the substrate and the wall. The region defines the through-hole.

It is preferable that the adhesive is softened when heated.

By softening the adhesive, it would be possible to reduce a difference between a pressure in the cavity and an external pressure.

It is preferable that at least one through-hole through which a pressure in the cavity can be adjusted is formed between the wall and the cover, and that the semiconductor device further includes third adhesive clogging the through-hole therewith.

It is preferable that the semiconductor device further includes fourth adhesive through which the cover is adhered to the wall, the fourth adhesive being not applied in at least one region between the wall and the cover. The region defines the through-hole.

There is still further provided a semiconductor device including (a) a substrate, (b) a semiconductor chip mounted on the substrate, (c) a wall having a closed cross-section and mounted on the substrate such that the semiconductor chip is surrounded by the wall, and (d) a cover covering the wall therewith so that a closed cavity is defined by the substrate, the wall and the cover, at least one of the wall and the cover being formed with at least one through-hole through which a pressure in the cavity can be adjusted, and (e) a device for clogging the through-hole therewith and attenuating a difference in pressure between the cavity and an atmospheric pressure.

For instance, the device is comprised of a thin film, in which case, it is preferable that the film sags so that a volume of the cavity can be varied.

It is preferable that the film is composed of metal.

By composing the film of metal, the film could have a resistance to fluctuation in pressure and temperature while the semiconductor device is being fabricated and even after the semiconductor device is completed. In addition, the film is not likely to be corroded.

There is yet further provided a semiconductor device including (a) a substrate, (b) a semiconductor chip mounted on the substrate, (c) a wall having a closed cross-section and mounted on the substrate such that the semiconductor chip is surrounded by the wall, and (d) a cover covering the wall therewith so that a closed cavity is defined by the substrate, the wall and the cover, the cavity being designed to be under a pressure higher than an external pressure.

By rendering the cavity under a pressure higher than an external pressure, a difference between a pressure in the cavity and an external pressure would prevent external air containing moisture from entering the semiconductor device, ensuring that electrical connections in the semiconductor device are kept away from moisture, dust and other foreign materials. As a result, it would be possible to prevent electric leakage and electromigration, and also prevent occurrence of "popcorn" phenomenon which might occur in an annealing step.

There is still yet further provided a semiconductor device including (a) a substrate, (b) a semiconductor chip mounted on the substrate, (c) a wall having a closed cross-section and mounted on the substrate such that the semiconductor chip is surrounded by the wall, and (d) a cover covering the wall therewith so that a closed cavity is defined by the substrate, the wall and the cover, the cavity being designed to be under a pressure lower than an external pressure.

By rendering the cavity under a pressure lower than an external pressure, it would be possible to prevent deformation of the substrate due to an increase in pressure in the cavity, resulted from an increase in temperature in an annealing step. As a result, it would be possible to prevent electric leakage and electromigration, and also prevent occurrence of "popcorn" phenomenon which might occur in an annealing step.

In another aspect of the present invention, there is provided a method of fabricating a semiconductor device, including the steps of (a) mounting both a semiconductor chip and a wall having a closed cross-section on a substrate such that the semiconductor chip is surrounded by the wall, and (b) covering the wall with a cover so that a closed cavity defined by the substrate, the wall and the cover is under a pressure almost equal to an atmospheric pressure at a temperature highest in both steps of fabricating the semiconductor device and steps expectable after the semiconductor device is completed.

It is preferable that the wall is covered with the cover in the step (b) in an enclosure which is kept at the pressure.

For instance, the step (b) may be comprised of (b1) adjusting a pressure in the cavity through at least one through-hole formed through at least one of the wall and the cover, and (b2) clogging the through-hole with adhesive.

As an alternative, the step (b) may be comprised of (b1) adjusting a pressure in the cavity through at least one through-hole formed between the substrate and the wall, and (b2) clogging the through-hole with adhesive.

It is preferable that the method further includes the step of applying second adhesive between the substrate and the wall to thereby adhere the wall to the substrate such that the second adhesive is not applied in at least one region which defines the through-hole.

For instance, the step (b) may be comprised of (b1) adjusting a pressure in the cavity through at least one through-hole formed between the wall and the cover, and (b2) clogging the through-hole with adhesive.

It is preferable that the method further includes the step of applying fourth adhesive between the wall and the cover to thereby adhere the cover to the wall such that the fourth adhesive is not applied in at least one region which defines the through-hole.

There is further provided a method of fabricating a semiconductor device, including the steps of (a) mounting both a semiconductor chip and a wall having a closed cross-section on a substrate such that the semiconductor chip is surrounded by the wall, (b) covering the wall with a cover so that a closed cavity is defined by the substrate, the wall and the cover, (c) adjusting a pressure in the cavity through at least one through-hole formed through at least one of the wall and the cover so that the pressure is almost equal to an atmospheric pressure at a temperature highest in both steps of fabricating the semiconductor device and steps expectable after the semiconductor device is completed, and (d) clogging the through-hole with a thin film.

It is preferable that the thin film is caused to sag when the through-hole is clogged with the thin film.

There is still further provided a method of fabricating a semiconductor device, including the steps of (a) mounting both a semiconductor chip and a wall having a closed cross-section on a substrate such that the semiconductor chip is surrounded by the wall, and (b) covering the wall with a cover so that a closed cavity defined by the substrate, the wall and the cover is under a pressure higher than an external pressure.

There is still further provided a method of fabricating a semiconductor device, including the steps of (a) mounting both a semiconductor chip and a wall having a closed cross-section on a substrate such that the semiconductor chip is surrounded by the wall, and (b) covering the wall with a cover so that a closed cavity defined by the substrate, the wall and the cover is under a pressure lower than an external pressure.

In still another aspect of the present invention, there is provided a nozzle used for a semiconductor device including (a) a substrate, (b) a semiconductor chip mounted on the substrate, (c) a wall having a closed cross-section and mounted on the substrate such that the semiconductor chip is surrounded by the wall, and (d) a cover covering the wall therewith so that a closed cavity is defined by the substrate, the wall and the cover, at least one of the wall and the cover being formed with at least one through-hole through which a pressure in the cavity can be adjusted, the nozzle being capable of absorbing the cover to thereby move the semiconductor device, adjusting a pressure in the cavity to a desired pressure through the through-hole, and clogging the through-hole with a plug with air being disallowed to pass through the through-hole.

For instance, the nozzle may be comprised of a hollow cylinder, a rod slidable in the cylinder, and a plug sucked to the rod at a distal end thereof.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 3A to 3G are cross-sectional views of a semiconductor device, illustrating respective steps of a method of fabricating a conventional semiconductor device in which a semiconductor chip is fixed on a substrate through underfilling resin.

FIG. 5A is a top view of another conventional semiconductor device with a cover taken away.

FIG. 5B is a cross-sectional view taken along the line VB—VB in FIG. 5A.

FIG. 5C is a cross-sectional view taken along the line VC—VC in FIG. 5A.

DESCRIPTION OF THE PREFERRED EMBODIMENTS

Preferred embodiments in accordance with the present invention will be explained hereinbelow with reference to drawings.

[First Embodiment]

Figure 1A:
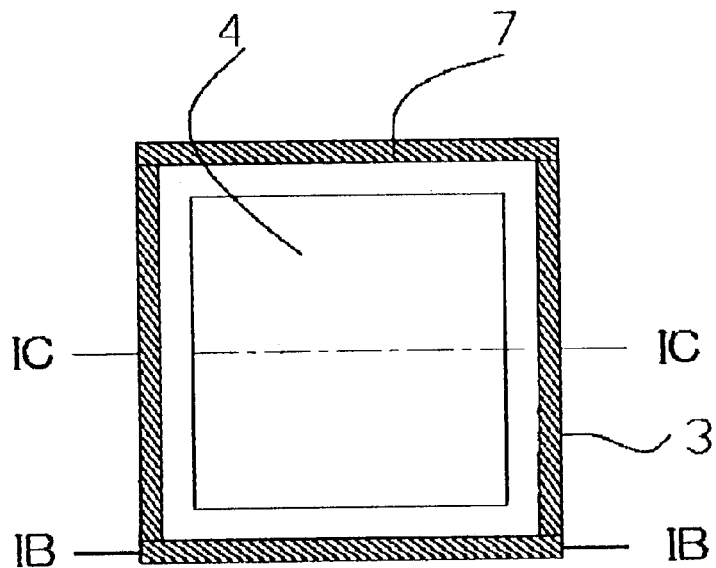
FIG. 1A is a top view of a conventional semiconductor device with a cover taken away.
Figure 1B:
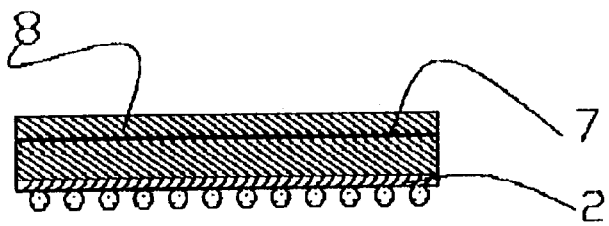
FIG. 1B is a cross-sectional view taken along the line IB—IB in FIG. 1A.
Figure 1C:
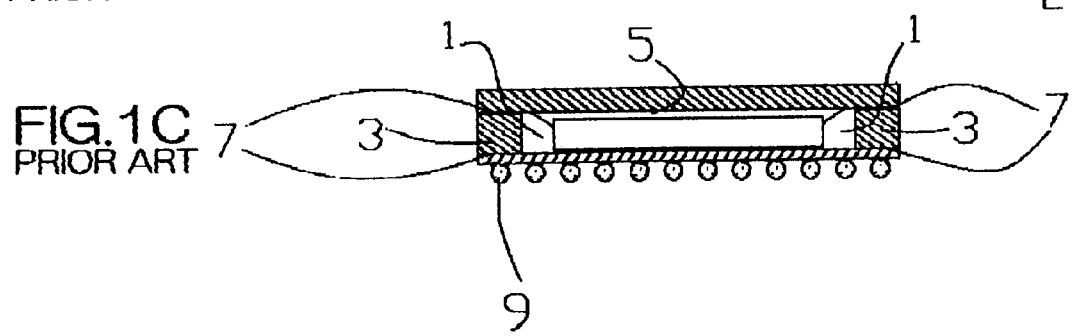
FIG. 1C is a cross-sectional view taken along the line IC—IC in FIG. 1A.
Figure 2A:
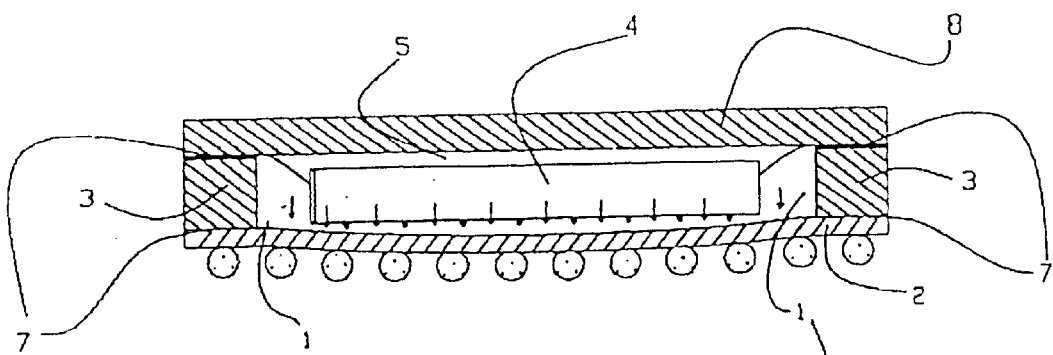
FIGS. 2A and 2B are a cross-sectional view of the semiconductor device illustrated in FIGS. 1A to 1C, showing that air enclosed in the cavity expands in an annealing step.
Figure 2B:
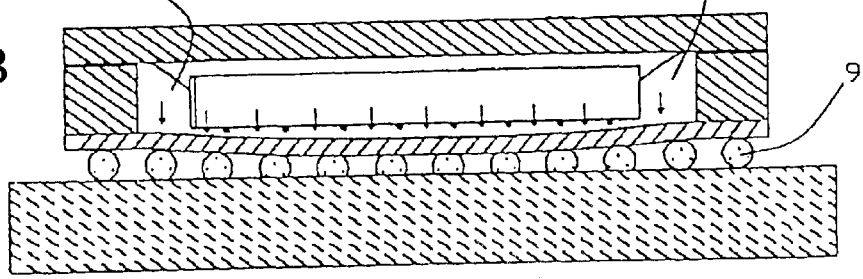
Figures 4A, 4B:
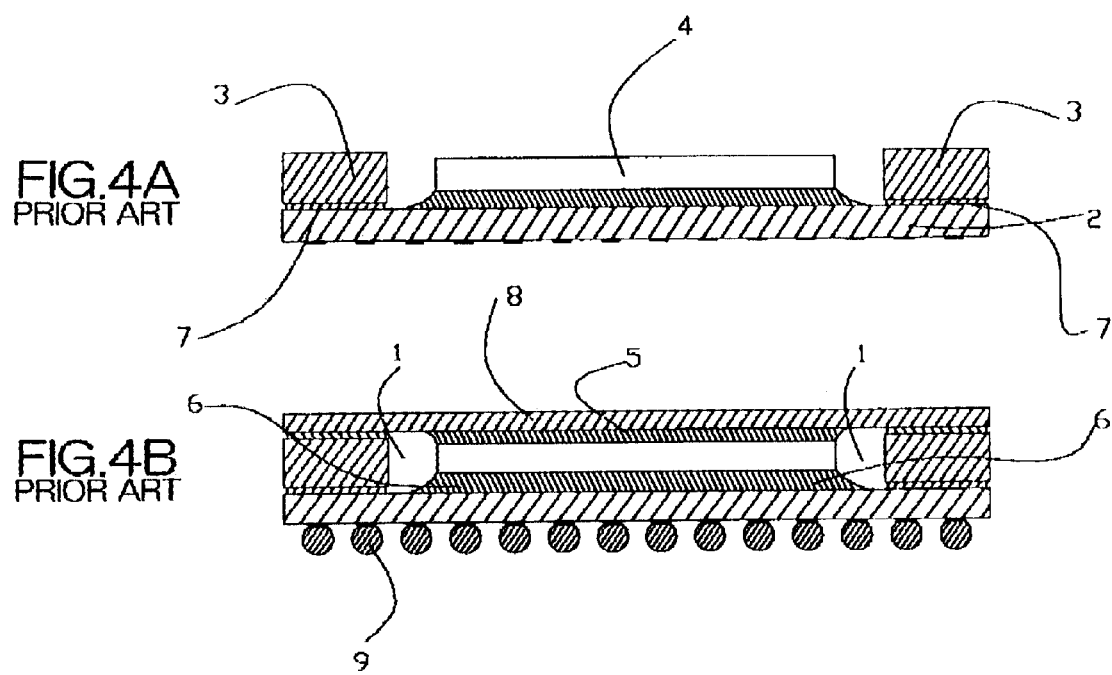
FIGS. 4A and 4B are cross-sectional views of a semiconductor device, illustrating respective steps of a method of fabricating a conventional semiconductor device, in which underfilling resin and adhesive are to be concurrently cured.
Figure 6A:
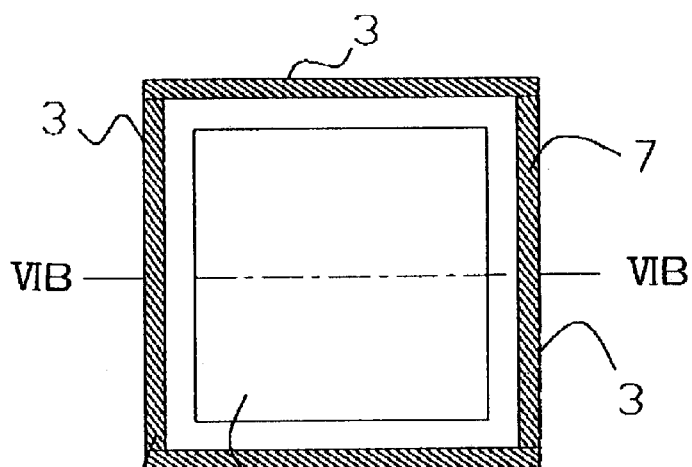
FIG. 6A is a top view of a semiconductor device in accordance with the first embodiment of the present invention, with a cover taken away.
Figure 6B:
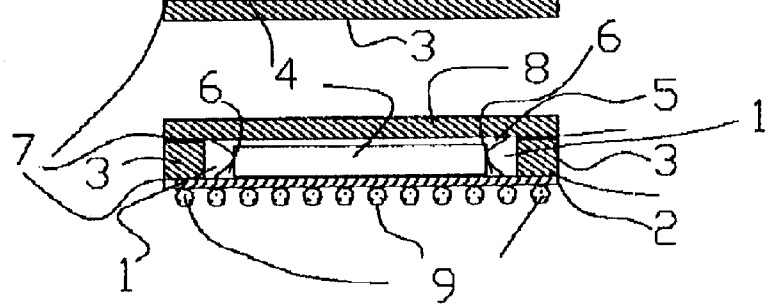
FIG. 6B is a cross-sectional view taken along the line VIB—VIB in FIG. 6A.

FIGS. 6A and 6B illustrate a semiconductor device in accordance with the first embodiment of the present invention.

The semiconductor device is comprised of is comprised of a square substrate 2, a square semiconductor chip 4 mounted centrally on the substrate 2, a wall 3 having a cross-section of a hollow square pole and mounted on edges of the substrate 2 so that the semiconductor chip 4 is surrounded by the wall 3, a square cover 8 covering the wall 3 therewith, first adhesive 7 adhering the cover 8 to the wall 3 and also adhering the wall 3 to the substrate 2, second adhesive 5 applied between an upper surface of the semiconductor chip 4 and a lower surface of the cover 8 for radiating heat therethrough, underfilling resin 6 applied between the semiconductor chip 4 and the substrate 2, and a plurality of spherical solder balls 9 arranged on a lower surface of the substrate 2.

The cover 8 is coextensive with the substrate 2. The semiconductor chip 4 has a projected area smaller than an area of the cover 8. The wall 3 has four sides each of which is equal in length to each of sides of the substrate 2, and is coextensive with the substrate 2.

The substrate 2 may be comprised of a film or may have a multi-layered structure composed of organic material. The wall 3 is composed of copper. The cover 8 is composed of a material having a high thermal conductivity, such as copper, aluminum, silicon carbide, and aluminum nitride. The first adhesive is composed of epoxy having a low coefficient of water absorption, cyanate ester, or polyolefin.

Pads (not illustrated) formed on the substrate 2 make contact with bumps (not illustrated) formed at a surface of the semiconductor chip 4 to thereby ensure electrical connection between the substrate 2 and the semiconductor chip 4. The wall 3 is mounted on the substrate 2 in order to enhance mechanical strength of the semiconductor device. The wall 3 is adhered to the substrate 2 through the first adhesive 7 without a gap. The cover 8 is adhered to the wall 3 through the first adhesive 7 in an opposite side of the substrate 2.

The second adhesive 5 is applied between an upper surface of the semiconductor chip 4 and a lower surface of the cover 8 to thereby hermetically adhere the semiconductor chip 4 to the cover 8 without any gap. The solder balls 9 are equally spaced from one another on a lower surface of the substrate 2.

A cavity 1 defined by the substrate 2, the wall 3, the second adhesive 5, the underfilling resin 6, and the cover 8 around the semiconductor chip 4 is designed to be under such a pressure that a predetermined difference between pressures inside and outside the cavity is accomplished at a predetermined temperature.

As an alternative, the cavity 1 is designed to be under a pressure almost equal to an atmospheric pressure at a temperature highest in both steps of fabricating the semiconductor device and steps expectable after the semiconductor device is completed.

Hereinbelow is explained a method of fabricating the semiconductor chip, with reference to FIGS. 7A to 7G.

Figure 7A:
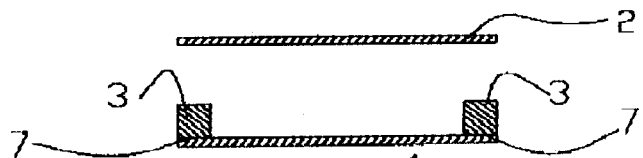
FIGS. 7A to 7G are cross-sectional views of the semiconductor device illustrated in FIGS. 6A and 6B, illustrating respective steps of a method of fabricating the semiconductor device.

First, as illustrated in FIG. 7A, there is prepared the substrate 2.

Figure 7C:
Figure 7D:
Figure 7E:
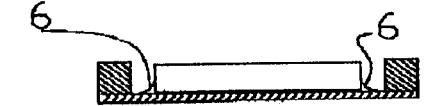
Figure 7B:
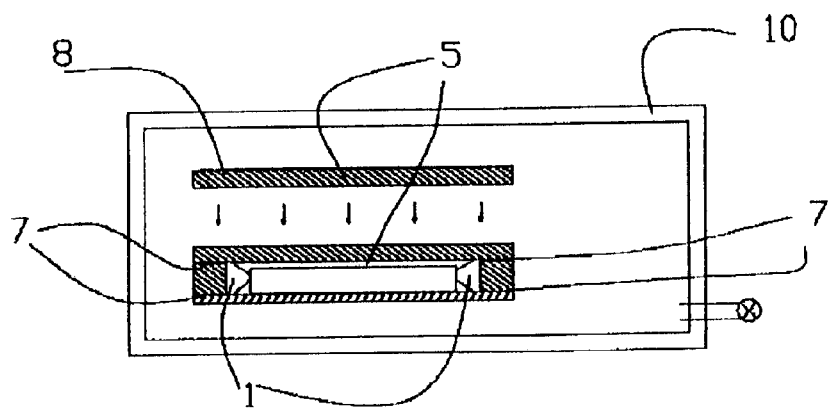

Then, as illustrated in FIG. 7B, the wall 3 having a cross-section of a hollow square pole is fixed on the substrate 2 through the first adhesive 7.

Then, as illustrated in FIG. 7C, the semiconductor chip 4 is electrically connected to the substrate 2 by causing pads (not illustrated) of the substrate 2 to make contact with bumps (not illustrated) of the semiconductor chip 4. Then, a product resulting from the step illustrated in FIG. 7C is washed with flux.

Then, as illustrated in FIG. 7D, the underfilling resin 6 is coated between the substrate 2 and the semiconductor chip 4, and then, heated. As a result, the underfilling resin 6 is cured and thus adhered to both the substrate 2 and the semiconductor chip 4.

An enclosure 10 illustrated in FIG. 7E is designed to control a pressure therein to a desired pressure. A product resulting from the step illustrated in FIG. 7C is put in the enclosure 10 kept under a desired pressure. Then, the second adhesive 5 for radiating heat therethrough is applied onto an upper surface of the semiconductor chip 4. Then, the cover 8 is put on the wall 3, as illustrated in FIG. 7E. Since the first adhesive 7 is applied to a lower surface of the cover 8 at a peripheral area thereof, the cover 8 is adhered to the wall 3. Then, the semiconductor device is heated. As a result, the first adhesive 7 is cured, and accordingly, the wall 3 is fixed to both the substrate 2 and the cover 8.

Then, the semiconductor device is taken out of the enclosure 10.

Then, the semiconductor device is turned upside down, and thereafter, the solder balls 9 are adhered to a lower surface of the substrate 2 by means of a jig 11. The solder balls 9 are vacuum-sucked to the jig 11, and the solder balls 9 are mounted onto a lower surface of the substrate 2 at a time, as illustrated in FIG. 7F.

Figure 7F:
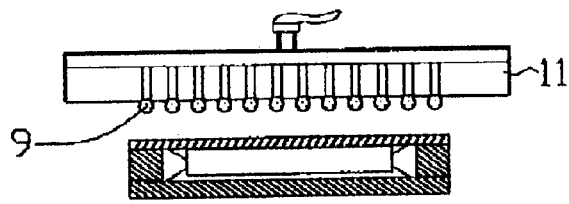
Figure 7G:
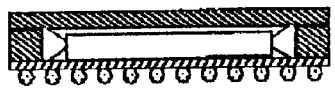

Then, a product resulting from the step illustrated in FIG. 7F is washed with flux. Thus, the semiconductor device as illustrated in FIG. 7G is completed.

When the thus completed semiconductor device is dry-packaged for shipping, it is preferable that the semiconductor device is dry-packaged in the enclosure 10 kept at a pressure in the range of about 1.1 to 1.5 atom. This ensures that external air is difficult to enter the semiconductor device and that foreign materials such as moisture which might exert harmful influence on the semiconductor device can be removed.

If external materials such as moisture and dust have to be prohibited from entering the semiconductor device while it is being fabricated, it is preferable that the semiconductor device is fabricated in the enclosure 10.

When the cover 8 is hermetically adhered to the wall 3, the substrate 2 is kept at about 200 degrees centigrade. Hence, the enclosure 10 is kept at a pressure of about 0.9 atom.

The enclosure 10 is designed to control a pressure therein in the range of about 0.5 atom to about 1.5 atom. For instance, the enclosure 10 is equipped with a rotary pump or a dry pump.

The underfilling resin 6 may be cured by heating after the semiconductor device is completed, in dependence on materials of which the substrate 2 is composed, or on specific semiconductor chips 4.

In accordance with the above-mentioned first embodiment, the cavity 1 is rendered under a pressure equal to a pressure at which the enclosure 10 is kept.

Hence, if the cavity 1 is rendered under a pressure higher than an external pressure, a difference between a pressure in the cavity 1 and an external pressure would prevent external air containing moisture from entering the semiconductor device, ensuring that electrical connections in the semiconductor device are kept away from moisture, dust and other foreign materials.

As an alternative, if the cavity 1 is rendered under a pressure lower than an external pressure, it would be possible to prevent deformation of the substrate due to an increase in pressure in the cavity, resulted from an increase in temperature in an annealing step.

As a result, it would be possible to prevent electric leakage and electromigration, and also prevent occurrence of "popcorn" phenomenon which might occur in an annealing step.

[Second Embodiment]

Figure 8A:
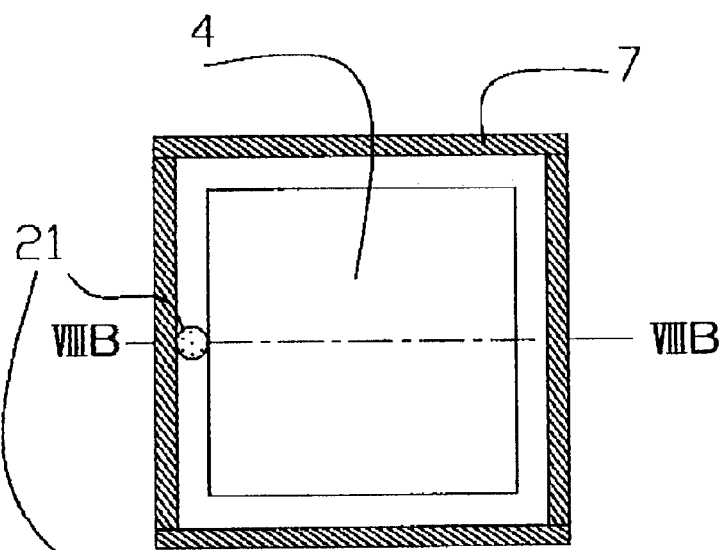
FIG. 8A is a top view of a semiconductor device in accordance with the second embodiment of the present invention, with a cover taken away.
Figure 8B:
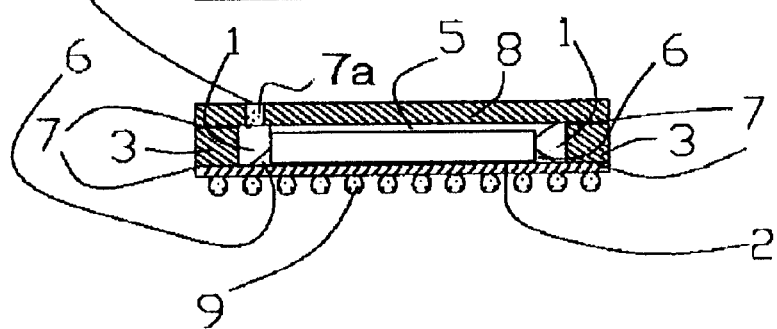
FIG. 8B is a cross-sectional view taken along the line VIIIB—VIIIB in FIG. 8A.

FIGS. 8A and 8B illustrate a semiconductor device in accordance with the second embodiment.

The semiconductor device is comprised of is comprised of a square substrate 2, a square semiconductor chip 4 mounted centrally on the substrate 2, a wall 3 having a cross-section of a hollow square pole and mounted on edges of the substrate 2 so that the semiconductor chip 4 is surrounded by the wall 3, a square cover 8 covering the wall 3 therewith and formed with a through-hole 21 allowing air to pass therethrough between the cavity 1 and outside of the semiconductor device, first adhesive 7 adhering the cover 8 to the wall 3 and also adhering the wall 3 to the substrate 2, second adhesive 5 applied between an upper surface of the semiconductor chip 4 and a lower surface of the cover 8 for radiating heat therethrough, underfilling resin 6 applied between the semiconductor chip 4 and the substrate 2, third adhesive 7a clogging the through-hole 21 therewith, and a plurality of spherical solder balls 9 arranged on a lower surface of the substrate 2.

In brief, the semiconductor device in accordance with the second embodiment is structurally different from the semiconductor device in accordance with the first embodiment in that the cover 8 is formed with the through-hole 21 which is clogged with the third adhesive 7a.

In the second embodiment, the cavity 1 is designed to be under such a pressure that a pressure in the cavity 1 becomes almost equal to an atmospheric pressure at a temperature in a step of annealing the semiconductor device.

A method of fabricating the semiconductor device in accordance with the second embodiment includes the same steps as the steps illustrated in FIGS. 7A to 7D, 7F and 7G in the method of fabricating the semiconductor device in accordance with the first embodiment.

First, the same steps as the steps illustrated in FIGS. 7A to 7D are carried out.

In a step corresponding to the step illustrated in FIG. 7E, the semiconductor device is heated with the through-hole 21 being not clogged, that is, air being allowed to pass through the through-hole 21 between the cavity 1 and outside of the semiconductor device. By heating the semiconductor device, moisture residual in the semiconductor device is exhausted outside of the semiconductor device.

Then, the semiconductor device is put in the enclosure 10. Then, a pressure in the cavity 1 is reduced down to such a pressure at a room temperature that a pressure in the cavity 1 becomes almost equal to an atmospheric pressure at a temperature highest in both steps of fabricating the semiconductor device and steps expectable after the semiconductor device is completed.

Thereafter, the through-hole 21 is clogged with the adhesive 7a to thereby disallow air to pass through the through-hole 21 between the cavity 1 and outside of the semiconductor device.

Then, the same steps as the steps illustrated in FIGS. 7F and 7G are carried out.

In accordance with the above-mentioned second embodiment, the cavity 1 is rendered under a pressure equal to a pressure at which the enclosure 10 is kept, after moisture residual in the semiconductor device has been exhausted out of the semiconductor device.

Hence, if the cavity 1 is rendered under a pressure higher than an external pressure, a difference between a pressure in the cavity 1 and an external pressure would prevent external air containing moisture from entering the semiconductor device, ensuring that electrical connections in the semiconductor device are kept away from moisture, dust and other foreign materials.

As an alternative, if the cavity 1 is rendered under a pressure lower than an external pressure, it would be possible to prevent deformation of the substrate due to an increase in pressure in the cavity, resulted from an increase in temperature in an annealing step.

As a result, it would be possible to prevent electric leakage and electromigration, and also prevent occurrence of "popcorn" phenomenon which might occur in an annealing step.

In the above-mentioned embodiment, though the through-hole 21 is formed at the cover 8, the through-hole 21 may be formed at the wall 3.

[Third Embodiment]

Figures 9A, 9B:
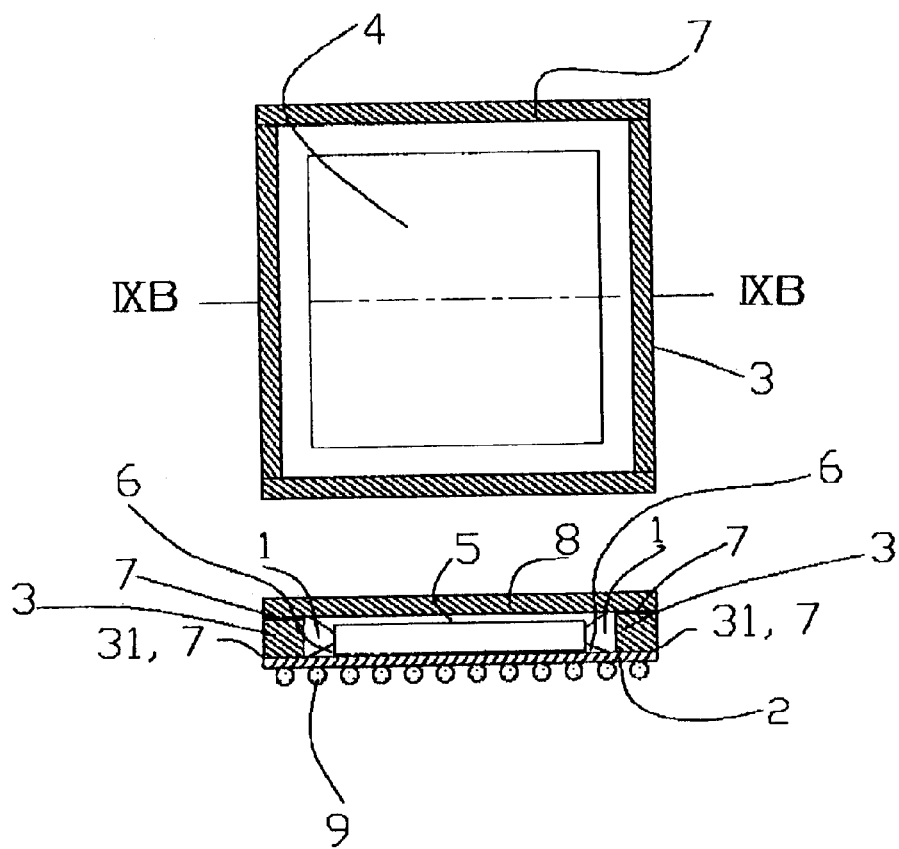
FIG. 9A is a top view of a semiconductor device in accordance with the third embodiment of the present invention, with a cover taken away.
FIG. 9B is a cross-sectional view taken along the line IXB—IXB in FIG. 9A.

FIGS. 9A and 9B illustrate a semiconductor device in accordance with the third embodiment.

The semiconductor device is comprised of is comprised of a square substrate 2, a square semiconductor chip 4 mounted centrally on the substrate 2, a wall 3 having a cross-section of a hollow square pole and mounted on edges of other substrate 2 so that the semiconductor chip 4 is surrounded by the wall 3, a square cover 8 covering the wall 3 therewith, first adhesive 7 adhering the cover 8 to the wall 3 and also adhering the wall 3 to the substrate 2, second adhesive 5 applied between an upper surface of the semiconductor chip 4 and a lower surface of the cover 8 for radiating heat therethrough, underfilling resin 6 applied between the semiconductor chip 4 and the substrate 2, and a plurality of spherical solder balls 9 arranged on a lower surface of the substrate 2.

The first adhesive 7 adhering the wall 3 to the substrate 2 is formed with a through-hole 31 allowing air to pass therethrough between the cavity 1 and outside of the semiconductor device. In the third embodiment, the through-hole 31 is clogged with thermoplastic adhesive (not illustrated). The first adhesive 7 adhering the wall 3 to the substrate 2 is composed of thermosetting resin.

After the adhesive 7 is formed with the through-hole 31, the semiconductor device is heated to thereby exhaust moisture residual in the semiconductor device, through the through-hole 31. Then, the through-hole 31 is clogged with the thermosetting resin adhesive 7 at that temperature.

A method of fabricating the semiconductor device in accordance with the third embodiment includes the same steps as the steps illustrated in FIGS. 7A, 7C, 7D, 7F and 7G in the method of fabricating the semiconductor device in accordance with the first embodiment.

First, the substrate 2 is prepared in the step illustrated in FIG. 7A.

Then, the wall 3 is fixedly adhered to the substrate 2 through the first adhesive 7. The first adhesive 7 is comprised of a first region in which the first adhesive 7 is applied thereon and a second region in which the first adhesive 7 is not applied thereon. Thus, the wall 3 is adhered to the substrate 2 through the first region of the first adhesive 7. The second region defines the through-hole 31.

Then, the same steps as the steps illustrated in FIGS. 7C and 7D are carried out.

Then, the cover 8 is adhered to the wall 3 through the first adhesive 7.

Then, the semiconductor device is heated to thereby exhaust moisture residual in the semiconductor device, through the through-hole 31. Thereafter, the semiconductor device is cooled down.

Then, the semiconductor device is put in the enclosure 10. Then, a pressure in the cavity 1 is reduced down to such a pressure at a room temperature that a pressure in the cavity 1 becomes almost equal to an atmospheric pressure at a temperature highest in both steps of fabricating the semiconductor device and steps expectable after the semiconductor device is completed.

Thereafter, the through-hole 31 defined by the second region of the adhesive 7 is clogged with thermoplastic adhesive (not illustrated) to thereby disallow air to pass through the through-hole 31 between the cavity 1 and outside of the semiconductor device.

The thermoplastic adhesive clogging the through-hole 31 therewith is softened in an annealing step, ensuring that it is possible to vary a volume of the cavity 1 to thereby reduce a difference between a pressure in the cavity 1 and an external pressure.

Then, the same steps as the steps illustrated in FIGS. 7F and 7G are carried out.

In accordance with the above-mentioned third embodiment, the cavity 1 is rendered under a pressure equal to a pressure at which the enclosure 10 is kept, after moisture residual in the semiconductor device has been exhausted out of the semiconductor device.

Hence, if the cavity 1 is rendered under a pressure higher than an external pressure, a difference between a pressure in the cavity 1 and an external pressure would prevent external air containing moisture from entering the semiconductor device, ensuring that electrical connections in the semiconductor device are kept away from moisture, dust and other foreign materials.

As an alternative, if the cavity 1 is rendered under a pressure lower than an external pressure, it would be possible to prevent deformation of the substrate due to an increase in pressure in the cavity, resulted from an increase in temperature in an annealing step.

As a result, it would be possible to prevent electric leakage and electromigration, and also prevent occurrence of "popcorn" phenomenon which might occur in an annealing step.

In the above-mentioned embodiment, though the through-hole 31 is formed in the first adhesive 7 adhering the wall 3 to the substrate 2, the through-hole 31 may be formed in the first adhesive 7 adhering the cover 8 to the substrate 2.

[Fourth Embodiment]

Figure 10A:
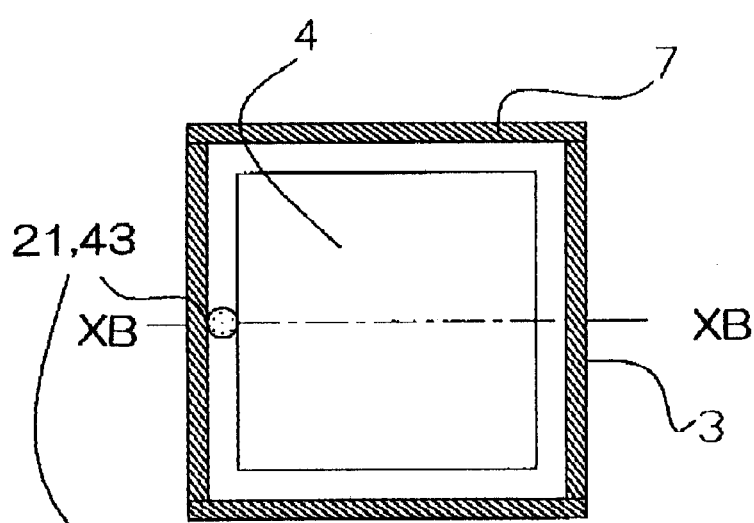
FIG. 10A is a top view of a semiconductor device in accordance with the fourth embodiment of the present invention, with a cover taken away.
Figure 10B:
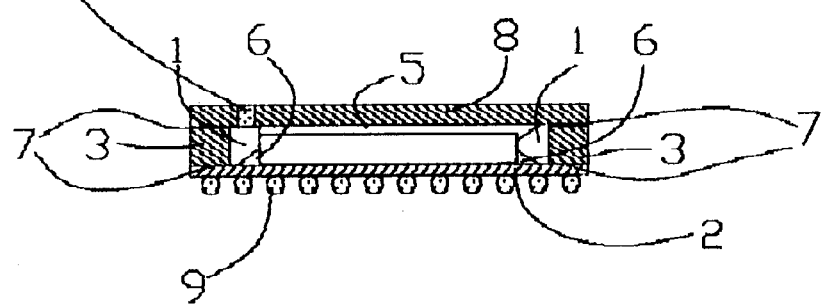
FIG. 10B is a cross-sectional view taken along the line XB—XB in FIG. 10A.

FIGS. 10A and 10B illustrate a semiconductor device in accordance with the fourth embodiment.

The semiconductor device is comprised of is comprised of a square substrate 2, a square semiconductor chip 4 mounted centrally on the substrate 2, a wall 3 having a cross-section of a hollow square pole and mounted on edges of the substrate 2 so that the semiconductor chip 4 is surrounded by the wall 3, a square cover 8 covering the wall 3 therewith and formed with a through-hole 21 allowing air to pass therethrough between the cavity 1 and outside of the semiconductor device, first adhesive 7 adhering the cover 8 to the wall 3 and also adhering the wall 3 to the substrate 2, second adhesive 5 applied between an upper surface of the semiconductor chip 4 and a lower surface of the cover 8 for radiating heat therethrough, underfilling resin 6 applied between the semiconductor chip 4 and the substrate 2, a plug 43 clogging the through-hole 21 therewith, and a plurality of spherical solder balls 9 arranged on a lower surface of the substrate 2.

In brief, the semiconductor device in accordance with the fourth embodiment is structurally different from the semiconductor device in accordance with the first embodiment in that the cover 8 is formed with the through-hole 21 which is clogged with the plug 43.

The plug 43 is composed of a material which is not deformed in a temperature range of a room temperature to a temperature highest in both steps of fabricating the semiconductor device and steps expectable after the semiconductor device is completed.

Hereinbelow is explained a structure of a pressure control nozzle 41 used in the fourth embodiment.

Figure 11:
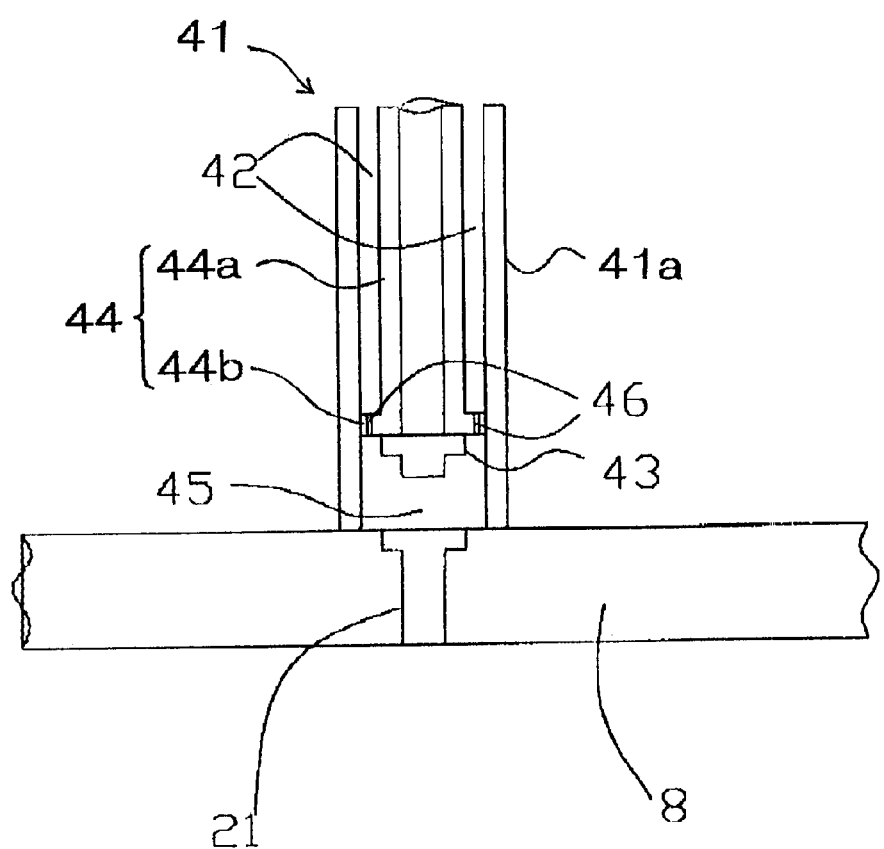
FIG. 11 is a cross-sectional view of a nozzle through which a pressure in the cavity is varied.

With reference to FIG. 11, the pressure control nozzle 41 is comprised of a hollow cylinder 41a, a rod 44 slidable in the cylinder 41a, and a plug 43 sucked to the rod 44 at a distal end thereof.

The rod 44 is comprised of a first hollow rod portion 44a having an outer diameter than an inner diameter of the cylinder 41a, and a second rod portion 44b having an outer diameter equal to an inner diameter of the cylinder 41a. The second rod portion 44b is integral with the first hollow rod portion 44a at its distal end. The second rod portion 44b is slidable along an inner wall of the cylinder 41a, and hence, the rod 44 is movable in the cylinder 41a in a length-wise direction of the cylinder 41a.

As illustrated in FIG. 11, a first annular space 42 is defined by the rod 44 and an inner surface of the cylinder 41a, and a second space 45 is defined by the second rod portion 44b, an inner surface of the cylinder 41a, and the cover 8. The second space 45 is in fluid-communication with the through-hole 21. The second rod portion 44b is formed with a plurality of through-holes 46 for allowing gas to pass therethrough between the first annular space 42 and the second space 45.

Figure 12A:
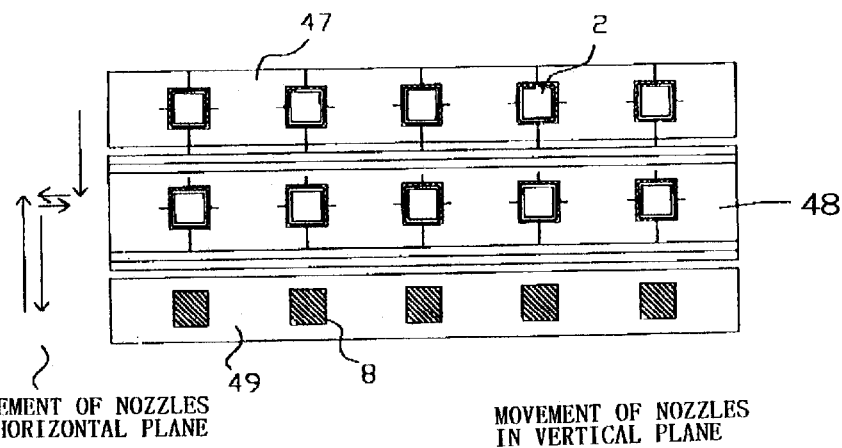
FIG. 12A is a top view of an apparatus for fabricating a plurality of semiconductor devices at a time.
Figure 12B:
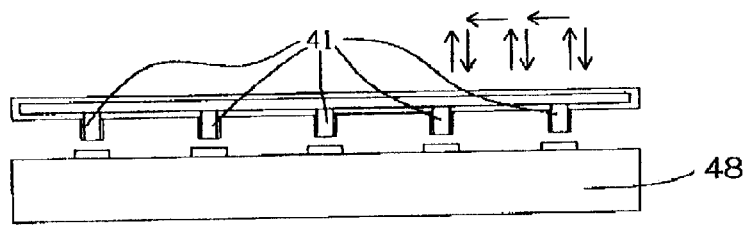
FIG. 12B is a partial side view of the apparatus illustrated in FIG. 12A.
Figure 12C:
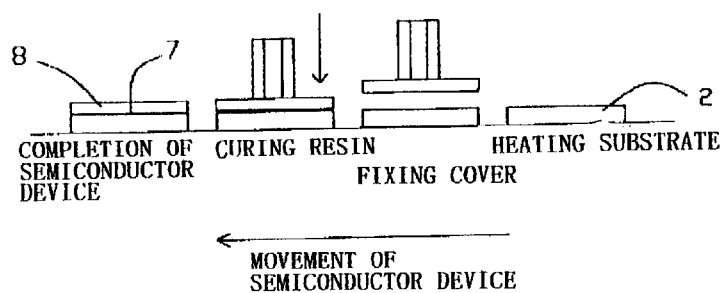
FIG. 12C illustrates movement of the nozzle illustrated in FIG. 11.

A method of fabricating the semiconductor device in accordance with the fourth embodiment is explained hereinbelow with reference to FIGS. 12A to 12C.

First, the same steps as the steps illustrated in FIGS. 7A to 7D are carried out.

Then, a plurality of the substrates 2 are placed on a first block 47. The substrates 2 are equally spaced away from adjacent ones on the first block 47. Then, as illustrated in FIG. 12B, a plurality of the nozzles 41 absorb the semiconductor chips 4 mounted on the substrates 2 placed on the first block 47, and move the substrates 2 onto a heater block 48.

Then, the semiconductor devices are heated on and by the heater block 48 at about 100 degrees centigrade to thereby exhaust moisture out of the semiconductor devices.

A plurality of the covers 8 are placed on a second block 49 at an interval equal to an interval between the adjacent semiconductor devices now placed on the heater block 48. The nozzles 41 absorb the covers 8 and then move the covers 8 onto the walls 3 standing on the substrates 2 lying on the heater block 48. Then, the nozzles 41 compress the covers 8 onto the walls 3 to thereby fix the covers 8 on the walls 3 in each of the semiconductor devices.

Then, the nozzles 41 are controlled to make contact with the through-holes 21 formed at the covers 8. Then, the nozzles 41 adjust a pressure in the cavity 1 in each of the semiconductor devices, to a desired pressure through each of the through-holes 21.

Then, while the nozzles 41 are kept to make close contact with the covers 8 around the through-holes 21 to thereby keep the cavity 1 under the desired pressure, the nozzles 41 clog the through-holes 21 with the plugs 43.

The plugs 43 are composed of thermosetting resin. Hence, the semiconductor devices are heated on and by the heater block 48 until the plugs 43 composed of thermosetting resin are cured.

Then, the same steps as the steps illustrated in FIGS. 7F and 7G are carried out.

Thus, a plurality of the semiconductor devices are completed at a time.

In accordance with the above-mentioned fourth embodiment, the cavity 1 is rendered under a desired pressure.

Hence, if the cavity 1 is rendered under a pressure higher than an external pressure, a difference between a pressure in the cavity 1 and an external pressure would prevent external air containing moisture from entering the semiconductor device, ensuring that electrical connections in the semiconductor device are kept away from moisture, dust and other foreign materials.

As an alternative, if the cavity 1 is rendered under a pressure lower than an external pressure, it would be possible to prevent deformation of the substrate due to an increase in pressure in the cavity, resulted from an increase in temperature in an annealing step.

As a result, it would be possible to prevent electric leakage and electromigration, and also prevent occurrence of "popcorn" phenomenon which might occur in an annealing step.

In the above-mentioned embodiment, though the through-hole 21 is formed at the cover 8, the through-hole 21 may be formed at the wall 3.

[Fifth Embodiment]

Figure 13A:
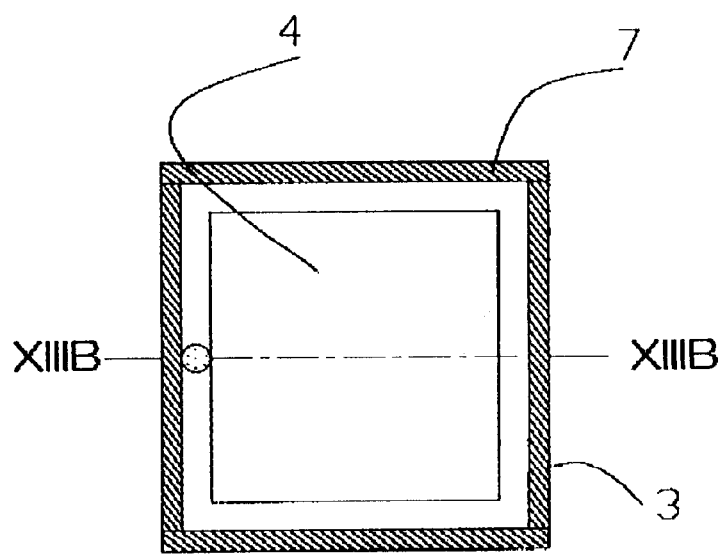
FIG. 13A is a top view of a semiconductor device in accordance with the fifth embodiment of the present invention, with a cover taken away.
Figure 13B:
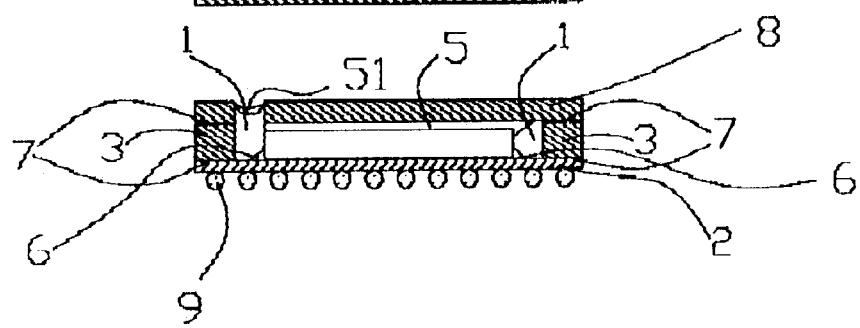
FIG. 13B is a cross-sectional view taken along the line XIIIB—XIIIB in FIG. 13A.

FIGS. 13A and 13B illustrate a semiconductor device in accordance with the fifth embodiment.

The semiconductor device is comprised of is comprised of a square substrate 2, a square semiconductor chip 4 mounted centrally on the substrate 2, a wall 3 having a cross-section of a hollow square pole and mounted on edges of the substrate 2 so that the semiconductor chip 4 is surrounded by the wall 3, a square cover 8 covering the wall 3 therewith and formed with a through-hole 21 allowing air to pass therethrough between the cavity 1 and outside of the semiconductor device, first adhesive 7 adhering the cover 8 to the wall 3 and also adhering the wall 3 to the substrate 2, second adhesive 5 applied between an upper surface of the semiconductor chip 4 and a lower surface of the cover 8 for radiating heat therethrough, underfilling resin 6 applied between the semiconductor chip 4 and the substrate 2, a thin metal film 51 clogging the through-hole 21 therewith, and a plurality of spherical solder balls 9 arranged on a lower surface of the substrate 2.

In brief, the semiconductor device in accordance with the fifth embodiment is structurally different from the semiconductor device in accordance with the second embodiment in that the through-hole 21 which is clogged with the thin metal film 51.

In the fifth embodiment, the cavity 1 is designed to be under such a pressure that a pressure in the cavity 1 becomes almost equal to an atmospheric pressure at a temperature in a step of annealing the semiconductor device.

Even if a pressure and a temperature vary in both steps of fabricating the semiconductor device and steps expectable after the semiconductor device is completed, the thin metal film 51 is kept flexible, is not be broken, and is not corroded.

The thin metal film 51 is designed to sag so that a volume of the cavity 1 can be varied.

A method of fabricating the semiconductor device in accordance with the fifth embodiment is the same as the method of fabricating the semiconductor device in accordance with the second embodiment except that the through-hole 21 is clogged with the thin metal film 51, whereas the through-hole 21 is clogged with the adhesive 7a in the second embodiment.

In accordance with the above-mentioned fifth embodiment, the cavity 1 is rendered under a pressure equal to a pressure at which the enclosure 10 is kept, after moisture residual in the semiconductor device has been exhausted out of the semiconductor device, similarly to the second embodiment.

Hence, if the cavity 1 is rendered under a pressure higher than an external pressure, a difference between a pressure in the cavity 1 and an external pressure would prevent external air containing moisture from entering the semiconductor device, ensuring that electrical connections in the semiconductor device are kept away from moisture, dust and other foreign materials.

As an alternative, if the cavity 1 is rendered under a pressure lower than an external pressure, it would be possible to prevent deformation of the substrate due to an increase in pressure in the cavity, resulted from an increase in temperature in an annealing step.

As a result, it would be possible to prevent electric leakage and electromigration, and also prevent occurrence of "popcorn" phenomenon which might occur in an annealing step.

In the above-mentioned fifth embodiment, though the through-hole 21 is formed at the cover 8, the through-hole 21 may be formed at the wall 3.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-41994 filed on Feb. 19, 1999 including specification, claims, drawings and summary is incorporated herein by reference in its entirety.

What is claimed is:

1. A semiconductor device comprising:
   (a) a substrate;
   (b) a semiconductor chip mounted on said substrate;
   (c) a wall having a closed cross-section and mounted on said substrate such that said semiconductor chip is substantially surrounded by said wall; and
   (d) a cover attached to a top portion of said wall so that a closed cavity is defined by said substrate, said wall and said cover,
   said cavity having a pressure with a predetermined difference between pressures inside and outside said cavity at a predetermined temperature.

2. A semiconductor device comprising:
   (a) a substrate;
   (b) a semiconductor chip mounted on said substrate;
   (c) a wall having a closed cross-section and mounted on said substrate such that said semiconductor chip is substantially surrounded by said wall; and
   (d) a cover attached to a top portion of said wall so that a closed cavity is defined by said substrate, said wall and said cover,
   said cavity having a pressure almost equal to an atmospheric pressure at a highest temperature of fabricating said semiconductor device and high temperature steps expectable after said semiconductor device is completed.

3. The semiconductor device as set forth in claim 2, wherein at least one of aid wall and said cover is formed with at least one through-hole through which a pressure in said cavity can be adjusted, and further comprising adhesive clogging aid through-hole therewith.

4. The semiconductor device as set forth in claim 3, wherein said adhesive is composed of thermosetting resin.

5. The semiconductor device as set forth in claim 3, wherein said adhesive is composed of a material which is not deformed in a temperature range of a room temperature to a temperature highest in both steps of fabricating said semiconductor device and steps expectable after said semiconductor device is completed.

6. The semiconductor device as set forth in claim 2, wherein at least one through-hole through which a pressure in said cavity can be adjusted is formed between said substrate and said wall, and further comprising first adhesive clogging said through-hole therewith.

7. The semiconductor device as set forth in claim 6, further comprising second adhesive through which said wall is adhered to said substrate, said second adhesive being not applied in at least one region between said substrate and said wall, said region defining said through-hole.

8. The apparatus as set forth in claim 6, wherein said first adhesive is softened when heated.

9. The semiconductor device as set forth in claim 2, wherein at least one through-hole through which a pressure in said cavity can be adjusted is formed between said wall and said cover, and further comprising third adhesive clogging said through-hole therewith.

10. The semiconductor device as set forth in claim 9, further comprising fourth adhesive through which said cover is adhered to said wall, said fourth adhesive being not applied in at least one region between said wall and said cover, said region defining said through-hole.

11. The apparatus as set forth in claim 9, wherein said third adhesive is softened when heated.

12. A semiconductor device comprising:
    (a) a substrate;
    (b) a semiconductor chip mounted on said substrate;
    (c) a wall having a closed cross-section and mounted on said substrate such that said semiconductor chip is substantially surrounded by said wall;
    (d) a cover attached to a top portion of said wall so that a substantially closed cavity is defined by said substrate, said wall and said cover, at least one of said wall and said cover being formed with at least one through-hole through which a pressure in said cavity can be adjusted; and
    (e) means for clogging said through-hole therewith and attenuating a difference in pressure between said cavity and an atmospheric pressure.

13. The semiconductor device as set forth in claim 12, wherein said means is comprised of a thin film.

14. The semiconductor device as set forth in claim 13, wherein said thin film sags so that a volume of said cavity can be varied.

15. The semiconductor device as set forth in claim 13, wherein said thin film is composed of metal.

16. A semiconductor device comprising:
    (a) a substrate;
    (b) a semiconductor chip mounted on said substrate;
    (c) a wall having a closed cross-section and mounted on said substrate such that said semiconductor chip is substantially surrounded by said wall; and
    (d) a cover attached to a top portion of said wall so that a closed cavity is defined by said substrate, said wall and said cover,
    said cavity having a pressure higher than an external pressure.

17. The semiconductor device as set forth in claim 16, wherein at least one of said wall and said cover is formed with at least one through-hole through which a pressure in said cavity can be adjusted, and further comprising a plug clogging said through-hole therewith.

18. The semiconductor device as set forth in claim 17, wherein said plug is composed of thermosetting resin.

19. The semiconductor device as set forth in claim 17, wherein said plug is composed of a material which is not deformed in a temperature range of a room temperature to a temperature highest in both steps of fabricating said semiconductor device and steps expectable after said semiconductor device is completed.

20. The semiconductor device as set forth in claim 16, wherein at least one through-hole through which a pressure in said cavity can be adjusted is formed between said substrate and said wall, and further comprising first adhesive clogging said through-hole therewith.

21. The semiconductor device as set forth in claim 20, further comprising second adhesive through which said wall is adhered to said substrate, said second adhesive being not applied in at least one region between said substrate and said wall, said region defining said through-hole.

22. The semiconductor device as set forth in claim 16, wherein at least one through-hole through which a pressure in said cavity can be adjusted is formed between said wall and said cover, and further comprising third adhesive clogging said through-hole therewith.

23. The semiconductor device as set forth in claim 22, further comprising fourth adhesive through which said cover is adhered to said wall, said fourth adhesive being not applied in at least one region between said wall and said cover, said region defining said through-hole.

24. A semiconductor device comprising:

(a) a substrate;

(b) a semiconductor chip mounted on said substrate;

(c) a wall having a closed cross-section and mounted on said substrate such that said semiconductor chip is substantially surrounded by said wall; and (d) a cover attached to a top portion of said wall so that a closed cavity is defined by said substrate, said wall and said cover, said cavity having a pressure lower than an external pressure.

25. The semiconductor device as set forth in claim 24, wherein at least one of said wall and said cover is formed with at least one through-hole through which a pressure in said cavity can be adjusted, and further comprising a plug clogging said through-hole therewith.

26. The semiconductor device as set forth in claim 25, wherein said plug is composed of thermosetting resin.

27. The semiconductor device as set forth in claim 25, wherein said plug is composed of a material which is not deformed in a temperature range of a room temperature to a temperature highest in both steps of fabricating said semiconductor device and steps expectable after said semiconductor device is completed.

28. The semiconductor device as set forth in claim 24, wherein at least one through-hole through which a pressure in said cavity can be adjusted is formed between said substrate and said wall, and further comprising first adhesive clogging said through-hole therewith.

29. The semiconductor device as set forth in claim 28, further comprising second adhesive through which said wall is adhered to said substrate, said second adhesive being not applied in at least one region between said substrate and said wall, said region defining said through-hole.

30. The semiconductor device as set forth in claim 24, wherein at least one through-hole through which a pressure in said cavity can be adjusted is formed between said wall and said cover, and further comprising third adhesive clogging said through-hole therewith.

31. The semiconductor device as set forth in claim 30, further comprising fourth adhesive through which said cover is adhered to said wall, said fourth adhesive being not applied in at least one region between said wall and said cover, said region defining said through-hole.

* * * * *